United States Patent
Visokay et al.

(10) Patent No.: US 6,770,521 B2
(45) Date of Patent: Aug. 3, 2004

(54) METHOD OF MAKING MULTIPLE WORK FUNCTION GATES BY IMPLANTING METALS WITH METALLIC ALLOYING ADDITIVES

(75) Inventors: Mark R. Visokay, Richardson, TX (US); Antonio L. P. Rotondaro, Dallas, TX (US); Luigi Colombo, Dallas, TX (US)

(73) Assignee: Texas Instruments Incorporated, Dallas, TX (US)

(*) Notice: Subject to any disclaimer, the term of this patent is extended or adjusted under 35 U.S.C. 154(b) by 74 days.

(21) Appl. No.: 10/135,725

(22) Filed: Apr. 29, 2002

(65) Prior Publication Data

US 2003/0104663 A1 Jun. 5, 2003

Related U.S. Application Data

(60) Provisional application No. 60/334,459, filed on Nov. 30, 2001.

(51) Int. Cl.$^7$ .......................................... H01L 21/8238
(52) U.S. Cl. ...................... 438/199; 438/217; 438/585; 438/587
(58) Field of Search ................................ 438/197–199, 438/217, 218, 585, 587, 588, 647, 652

(56) References Cited

U.S. PATENT DOCUMENTS

| 6,130,123 A | * | 10/2000 | Liang et al. | ................. 438/217 |
| 6,376,888 B1 | * | 4/2002 | Tsunashima et al. | ........ 257/407 |
| 6,383,879 B1 | * | 5/2002 | Kizilyalli et al. | ........... 438/303 |

OTHER PUBLICATIONS

Paasch and Schaller, "Thermodynamic properties of palladium —X Alloys, With X =Gd, Y, Ce", Bertichte der Bunsen —Gesellschaft, vol. 87(9), p. 812–14 (1983).*
CRC Handbook of Chemistry and Physics, p. 12 —130, 82nd Edition, CRC press (2001–2002).*

* cited by examiner

Primary Examiner—Evan Pert
Assistant Examiner—Asok Kumar Sarkar
(74) Attorney, Agent, or Firm—Carlton H. Hoel; W. James Brady; Frederick J. Telecky, Jr.

(57) ABSTRACT

A method of forming a first and second transistors with differing work function gates by differing metals with a second metal selectively implanted or diffused into a first metal.

14 Claims, 4 Drawing Sheets

METHOD OF MAKING MULTIPLE WORK FUNCTION GATES BY IMPLANTING METALS WITH METALLIC ALLOYING ADDITIVES

CROSS-REFERENCES TO RELATED APPLICATIONS

The following provisional patent application discloses related subject matter, Ser. No. 60/334,459, filed Nov. 30, 2001.

BACKGROUND OF THE INVENTION

The present invention relates to semiconductor transistor fabrication and more particularly to complementary transistors and integrated circuits containing them.

Integrated circuit technology continues to advance at a rapid pace, with many circuit technologies being implemented using semiconductor fabrication processes. With the advancement of semiconductor circuit fabrication methods, consideration is given to various aspects, including maximizing efficiency, lowering manufacturing cost, and increasing performance. With these goals in mind, one area is the continuing trend of reducing the thickness of the transistor gate dielectrics. For example, in the past the gate dielectric (e.g., silicon dioxide or nitrided silicon dioxide) layer thickness was on the order of 10 nm, but more recently that thickness has reduced considerably with a more current goal being on the order of 2 nm. Indeed, this goal will strive for even thinner gate dielectric layers in the foreseeable future. This goal reduces device size and facilitates improved device performance.

While the desirability and trend toward thinner gate dielectrics continues, such an approach also provides a considerable drawback. Specifically, overlying the thin gate dielectric is a polycrystalline silicon ("polysilicon") gate layer, and polysilicon naturally includes a depletion region at the interface between the polysilicon gate and the gate dielectric. Typically, the depletion region manifests itself as providing the electrical equivalent of approximately a 0.3 nm thick insulator and, as such, the region in effect provides an insulating effect rather than a conducting effect as would be present in the remainder of the polysilicon gate conductor. Using the preceding numeric example, therefore, for a 10-nm thick gate dielectric, then the overlying effective 0.3-nm thick polysilicon depletion region may be thought to effectively increase the overall insulation between the gate and the underlying transistor channel from 10 nm to 10.3 nm, that is, the effect of the depletion region affects the insulating thickness by three percent—as such, for previous thicker gate insulators the effect of the polysilicon depletion region may be considered to have a negligible impact on the gate dielectric. In contrast, however, for a 2-nm thick gate dielectric, the polysilicon gate conductor depletion region may be thought to increase the gate insulator to 2.3 nm, thereby representing an increase on the order of 15 percent. This increased percentage significantly reduces the benefits otherwise provided by the thinner gate dielectric.

One approach in general to avoiding the depletion region phenomenon of polysilicon transistor gates is to use metal as an alternative material for the transistor gate because metal does not present a considerable depletion region, if any. Prior to the more recent use of polysilicon gates, metal gates were fairly common. However, a previously-identified drawback of such metal gates, which indeed led to the avoidance of such metals in contemporary devices, is that each metal has a corresponding so-called work function, and in the transistor art each transistor also has a corresponding preferred value for a work function of the gate electrode. However, the desired work function value differs for different transistor types. For example, based on present day threshold voltage channel doping, a p-channel MOS transistor ("PMOS") is optimized when the gate electrode has a work function on the order of 5 eV; while an n-channel MOS transistor ("NMOS") is optimized when the gate electrode has a work function on the order of 4 eV. The problem with previously-used metal gates arose with the development of CMOS circuits which, by definition, include both PMOS and NMOS transistors. Specifically, because a metal gate provides only a single work function, then it could not be selected to provide the two different desired work functions of the PMOS and NMOS devices. Instead, at best a metal could be selected to be between the desired work function of a PMOS and an NMOS transistor, which is sometimes referred to as the "midgap" between these devices (i.e., on the order of 4.5 eV for the preceding examples). This inability to match different work functions led to the use of polysilicon gates whereby the polysilicon gates of the NMOS devices could be doped in a first manner in view of the desired work function for NMOS transistors and the polysilicon gates of the PMOS devices could be doped in a second manner in view of the desired work function for PMOS transistors.

More recent approaches have used two different metals for gates. For example, U.S. Pat. No. 6,265,258 deposits a tantalum metal gate layer (work function about 4.2 eV) and then selectively nitrides the portion over the PMOS areas to form tantalum nitride gates (work function about 5.4 eV) while the NMOS gates remain tantalum. Similarly, U.S. Pat. No. 6,204,103 deposits polysilicon and over the NMOS areas deposits titanium and over the PMOS areas deposits molybdenum; then an anneal simultaneously forms titanium silicide gates for NMOS and molybdenum silicide gates for PMOS. And Polishchuk et al, Dual Work Function Metal Gate CMOS Technology Using Metal Interdiffusion, 22 IEEE Elect. Dev. Lett. 444–446 (2001) describes forming two CMOS gates of two differing metals: Ti and a Ti:Ni mixture with the Ni segregrating at the gate dielectric interface by diffusion of the Ni through the Ti. This provides gate work functions of about 3.9 (Ti) for the NMOS and about 5.3 (Ni) for the PMOS.

However, the foregoing two metal or silicide gate approaches have processing drawbacks including silicide interface discontinuities.

SUMMARY OF THE INVENTION

The present invention provides a method of forming transistor gate electrodes with differing related metals for NMOS and PMOS in CMOS integrated circuits.

This has advantages including simple processing for enhanced performance of CMOS integrated circuit devices.

DETAILED DESCRIPTION OF THE PREFERRED EMBODIMENTS

FIGS. 1–6 illustrate in cross-sectional elevation views steps of a first preferred embodiment method of CMOS fabrication. Preferred embodiment methods and CMOS structures replace the n-type and p-type polysilicon gate electrodes with metal alloy gate electrodes. This has advantages including lower gate resistance, eliminated dopant diffusion problems and prevention of gate electrode depletion effects of doped (poly)silicon gate electrodes. In fact, the preferred embodiment gate electrodes may be used with either high-k gate dielectrics or with known silicon dioxide and silicon oxynitride gate dielectrics or other gate dielectrics. The preferred embodiments maintain the work function of the gate electrode material to approximately equal that of the underlying silicon channel region. Thus NMOS gate electrodes should have a work function approaching 4.0–4.2 eV which is the work function of n+ silicon, and PMOS gate electrodes should have a work function approaching 5.0–5.2 eV which is the work function of p+ silicon.

The first preferred embodiment employs metal gate electrodes with palladium (Pd) for the PMOS gate electrode and palladium-yttrium alloy ($Pd_3Y$) for the NMOS gate electrode. Polycrystalline Pd has a work function of about 5.2 eV and polycrystalline Y has a work function of about 3.1 eV. The first preferred embodiment method fabricates such gates as illustrated in FIGS. 1–6. Note that FIGS. 1–6 illustrate in cross-sectional elevation view a semiconductor structure but with only a single PMOS and a single NMOS transistor for clarity; in a single integrated circuit there may be tens of millions of NMOS and PMOS transistors. Also the various layers shown in the Figures are not shown to scale to simplify the following discussion and because varying thickness may be employed.

Figure 1:
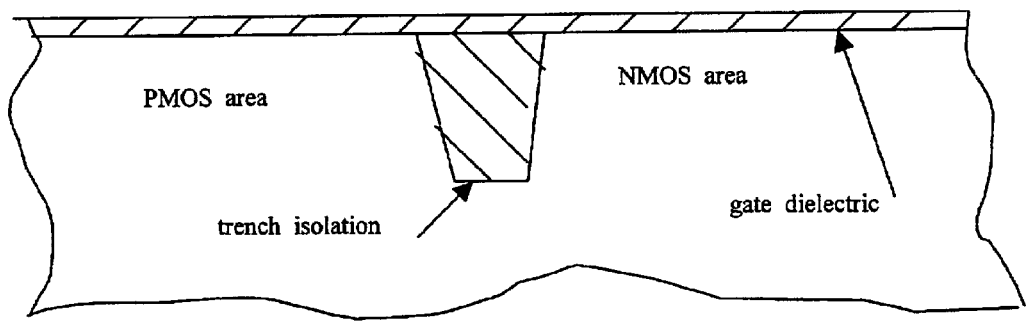
FIGS. 1–6 illustrate in cross-sectional elevation views steps of a first preferred embodiment method of fabrication.

Turning to FIG. 1, the first preferred embodiment begins with a semiconductor surface formed preferably by a substrate that is preferably formed from silicon with shallow trench isolation (trench depth such as 300 nm). Various dopant implantations into the silicon substrate to define wells, channel stops, punch-through suppression, and threshold voltages may be performed separately for the NMOS and PMOS areas. A gate dielectric layer is formed over the substrate, where the material for the dielectric layer is preferably chosen so that portions of the dielectric layer later function as gate dielectrics for complementary PMOS and NMOS transistors. The gate dielectric of thickness such as 2–10 nm may be a high-k dielectric such as $HfSiO_4$ with various Hf to Si ratios to ensure amorphicity or HfSiON, or silicon dioxide or oxynitrides, SiON, or other materials which will be stable in contact with silicon and the metals to be formed.

Figure 2:
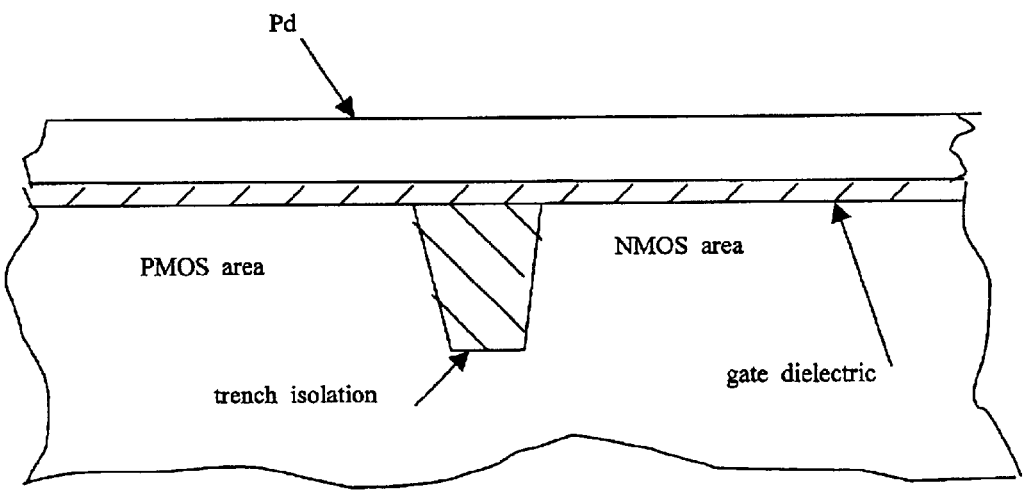

FIG. 2 shows a palladium layer formed on the gate dielectric layer. In the preferred embodiment, the palladium layer may be polycrystalline or amorphous and of thickness about 100 nm. As between these alternatives, preferably the selection is such that, at the stage in the process, the chosen palladium layer does not react with the underlying gate dielectric layer and the thermal budget is minimized to prevent any recrystallization of an amorphous gate dielectric layer when a high-k dielectric is used. For example, an amorphous palladium layer may be formed by sputtering or evaporation at room temperature. Note also that the manner in which the palladium layer is formed may be according to various alternatives, again where the choice of such an alternative is preferably directed to ensuring lower thermal budget. As an alternative, a plasma-enhanced chemical vapor deposition ("PECVD") may be used because it too uses a relatively low temperature, where this temperature may be above room temperature yet the PECVD may prove more easily implemented as compared to the sputter technique. Another alternative would be the use of atomic layer deposition (ALD). Lastly, a thermal CVD process may be used, but caution should be taken to ensure that any temperature constraint of that process does not cause a reaction between the gate dielectric layer and the palladium layer.

Figure 3:
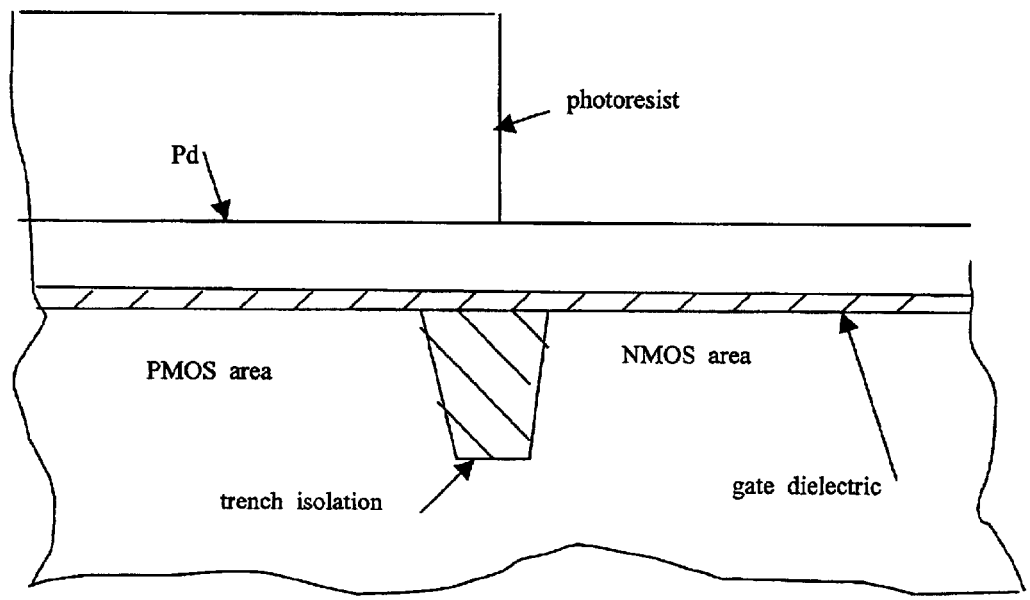

FIG. 3 illustrates forming a photoresist layer over the palladium layer and then patterning that photoresist layer to leave a photoresist portion of the photoresist layer. Thereafter, an implantation of yttrium is performed with a dose of $2\times10^{16}$ ions/$cm^2$ and at an energy of about 1 MeV. This energy yields an yttrium peak at a depth of roughly 90 nm from the palladium surface; that is, about 10 nm from the gate dielectric, and with a straggle of roughly 15–20 nm. The $2\times10^{16}$ ions/$cm^2$ dose is equivalent to an yttrium layer of thickness of 7–10 nm, so the implant yields a mixture of roughly 75% Pd and 25% Y over the 20–30 nm adjacent the gate dielectric. The yttrium implant is into the NMOS area palladium not covered by photoresist, thereby leaving unimplanted palladium at the PMOS areas under the photoresist. Optionally add a hardmask under the photoresist to compensate for implantation degradation of the photoresist. Such a hardmask may be formed by depositing 1 um thick silicon dioxide (e.g., from TEOS) on the palladium, photoresist masking and etching of the oxide over the NMOS areas, and then Y implanting. Thus both the photoresist and the oxide hardmask cover the PMOS areas during the implantation.

Figure 4:
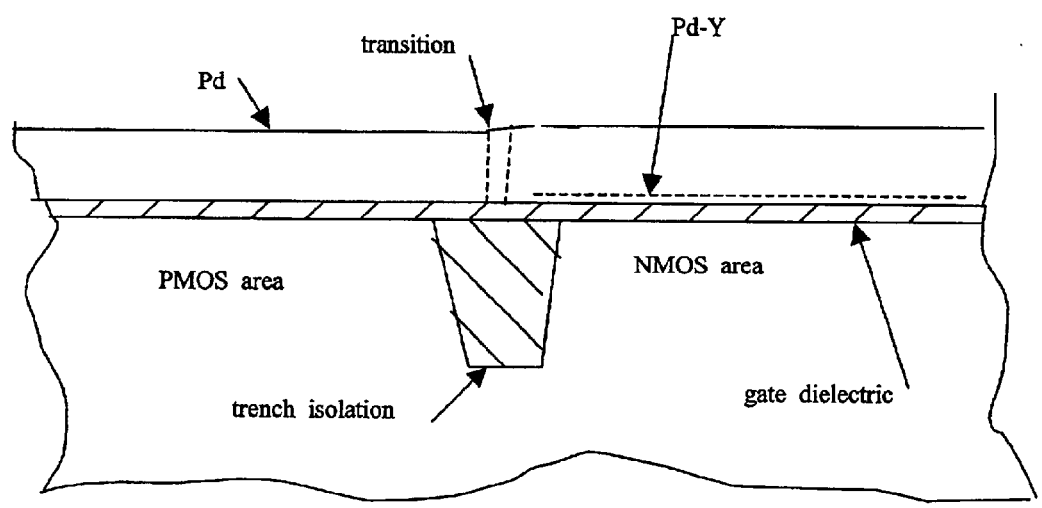

FIG. 4 illustrates in cross-sectional elevation view the structure from FIG. 3 after the following two additional processing steps.

As a first step reflected in FIG. 4, the photoresist (see FIG. 3) is removed, and this removal step may be accomplished in various manners. For example, either an oxygen or hydrogen ash may be used, although an oxygen approach is less favored because it may pose a risk of oxidation of the palladium or alloy. As still another example, a solvent may be chosen, in which case the particular solvent should be selected so as not to damage either the palladium or alloy. In any event, once the photoresist is removed, the unimplanted palladium is exposed.

As a second step reflected in FIG. 4, an anneal step is performed preferably after the photoresist is removed. The anneal step may be achieved using various atmospheres, temperatures and times, and by way of example a rapid thermal processing ("RTP") operation may be used whereby a relatively short anneal is performed at temperatures of 500° C. or greater in a low pressure (5 Pa) inert (argon) atmosphere. In the first preferred embodiment, the anneal drives polycrystallization of the metal (which had been amorphized by the implantation) and formation of the intermetallic compound $Pd_3Y$ in a neighborhood of the gate dielectric. The actual temperature and time used in the anneal step may depend upon the specific implant dose. Note that the anneal could be postponed until after gate etch, and that the implantation increases the volume of the layer.

Figure 5:
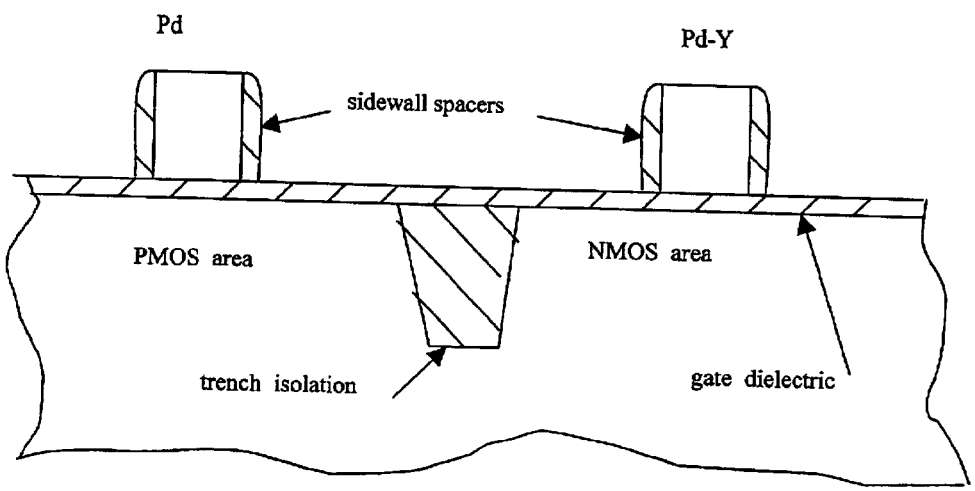

FIG. 5 illustrates the results of a gate etch of the metal (Pd and Pd—Y) plus subsequent sidewall spacer formation. In particular, first, a photoresist layer is formed and patterned over the structure of FIG. 4 to thereby form photoresist portions overlying the palladium and palladum-yttrium materials and defining locations of the NMOS and PMOS gates plus interconnections at the gate level. Second, an etch of the metals is performed down to the dielectric layer. The etch may be in two stages with an initial high temperature etch using a high-density plasma including fluorine or chlorine followed by a second etch using a plasma containing chlorine. The initial fluorine or chlorine etch rapidly removes the bulk of the Pd and Y and the chlorine etch completes metal removal plus effectively stops on the dielectric and allows overetching. The resulting structures following this etch are shown in FIG. 5 and include two gate electrodes. With respect to the PMOS gate electrode, it includes a portion which remains from the etch of the palladium, and a portion of dielectric layer that separates the palladium from the substrate and this palladium portion serves as a gate dielectric. With respect to the NMOS gate electrode, it includes a Pd—Y portion which remains from the etch of the yttrium-implanted palladium, and a portion of dielectric layer that separates this Pd—Y portion from the substrate and, thus, this portion serves as a gate dielectric.

Figure 6:
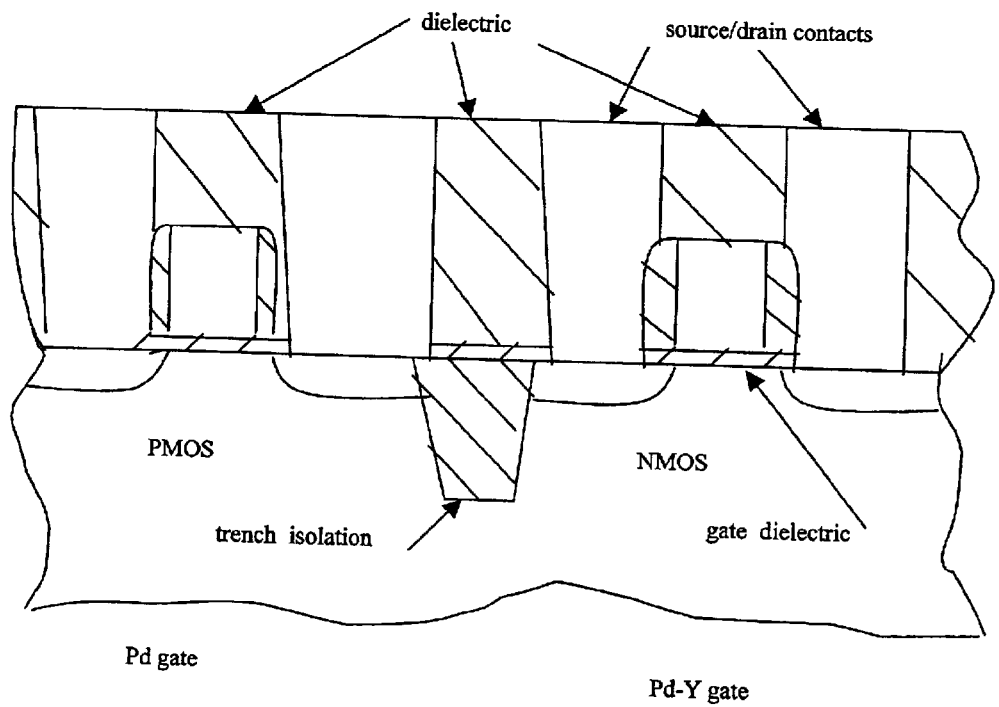

Various additional observations now may be made with respect to the resulting structure in FIG. 5. As a first observation, the two gate electrodes provide structures from which two different transistors may be formed, where the gate of each respective transistor has a different work function because each electrode includes a different material. For example, an NMOS transistor may be formed (i.e., self-aligned implants of n-type dopants to form source/drains and any source/drain extensions or pocket implants) with respect to the Pd—Y gate electrode which thereby implements a gate having the work function of the yttrium-implanted palladium in the neighborhood of the gate dielectric, while a PMOS transistor may be formed with respect to the palladium gate electrode which thereby implements a gate having the work function of the polycrystalline Pd. To further illustrate these aspects and as a second observation, insulating sidewall spacers may be formed with respect to the gate materials and their underlying gate insulators by blanket deposition followed by anisotropic etching; such sidewall spacers are shown in FIG. 5. Additionally, various further transistor aspects as may be implemented with respect to the gate electrodes, including but not limited to n-wells or p-wells, source/drain regions, channel implants, isolation oxides, and the like. As previously noted, some of these regions may be formed prior to the formation of the gate electrodes, such as the formation of isolation regions to later define boundaries for source/drain implants and a well of a given conductivity type such as an n-well for a PMOS transistor, while others of these regions may be formed after the formation of the gate electrodes, such as the formation of the source/drain regions. As a final observation, the preferred embodiment methodology as illustrated in FIGS. 1 through 5 demonstrates still another benefit arising with respect to the formation of the gate insulators in the gate active area. Specifically, from the above, note that the etch down to the dielectric layer does not reach those portions of that layer that serve as active gate insulators. Thus, the material properties of these gate insulators are not affected by a direct exposure of these regions to the etch chemistry. Indeed, FIG. 6 illustrates subsequent structure after deposition of a premetal dielectric (PMD) and formation of contacts to source/drains.

Figure 7:
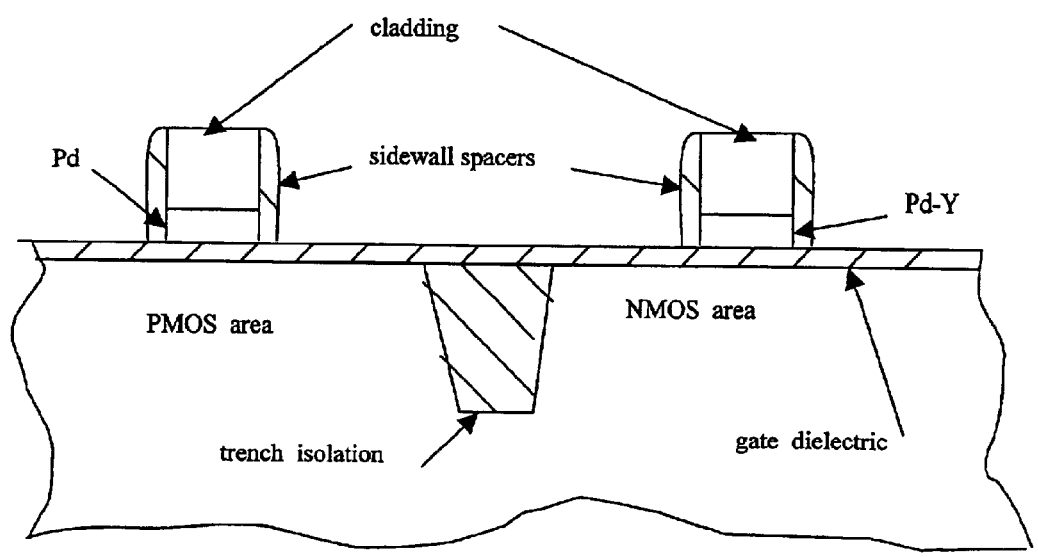
FIG. 7 illustrates a second preferred embodiment method.

FIG. 7 illustrates in cross-sectional elevation view an alternative structure which is created with analogous processing steps, and this structure shares various attributes with the previous structure of FIG. 5 in that the Pd and Pd—Y gates determine the work functions, but the metals may be thin (e.g., less than the 100 nm deposited Pd) and the cladding layer is a metal which provides the majority of the gate thickness, or the Pd and Pd—Y gates may have the previous thickness and the cladding layer may be a dielectric which could act as a hardmask during the gate etch. In particular, for the case of thin initial palladium with metal cladding, in FIG. 2 deposit palladium to a thickness of 30 nm, and pattern as in FIG. 3. Then implant yttrium to a peak depth of 25 nm with 5 nm straggle, and anneal as in FIG. 4. Then deposit further palladium to a thickness of 75 nm to form the cladding layer. Then pattern photoresist to define the gates and etch down to the dielectric layer as previously described. As a result, two gate electrodes are formed, but each gate electrode includes an additional clad layer.

The inclusion of the additional cladding layer may be used for various purposes. For example, if the approach of FIG. 5 would result in gate electrodes of an insufficient thickness, then the use of an additional metal clad layer thereby increases the height of the gate electrodes. As another example, if a lower sheet resistance is desired than that achieved by the approach of FIG. 5, then the FIG. 7 approach may be implemented where the material for the clad layer is selected to alter the sheet resistance. For example, various materials may be considered to reduce the overall sheet resistance of the gate electrodes, such as various metals, and indeed preferably refractory metals, such as tungsten, tantalum, titanium, tungsten nitride, tantalum nitride, and titanium nitride, and also others, and thickness of the cladding layer may be 50–300 nm in the preferred embodiment. Also, the cladding metal may be chosen to provide easy etching, and thus the portion of the gate etch of Pd and Pd—Y can be minimized. In any event, once the etch to form the gate electrodes is completed, the photoresist may be removed and insulating sidewalls may be formed, as shown in FIG. 7. Lastly, various other benefits realized by the structure of FIG. 5 are also realized by the structure of FIG. 7.

From the above, it may be appreciated that the foregoing preferred embodiments provide a set of transistor gates where one gate is formed from a metal and the other gate is formed from an alloy or intermetallic of this metal. In the preferred embodiment, one metal is palladium while the metal alloy or intermetallic is palladium-yttrium. Given these resulting structures, the preferred embodiment produces various benefits. For example, each transistor gate has a different work function, and indeed the palladium gate structure proves useful as a PMOS gate electrode while the palladium-yttrium gate structure proves useful as an NMOS gate electrode. As another example, transistors may be formed using these resulting structures along with relatively thin gate dielectrics, and the overlying metal gates will not include a substantial depletion region as is the case for polysilicon gate transistors. As still another example, while palladium and yttrium have been shown as preferred metals, other metals may be used as described in the following paragraphs. And further preferred embodiments form the two metals by methods other than implantation.

Alternative metals may be used with the preferred embodiment method of implantation of a first metal to form a second metal (alloy or intermetallic) and thereby adjust the work function without exposing the underlying dielectric to any etching. In particular, the first preferred embodiment could be varied by initially depositing the alloy $Pd_{0.9}Y_{0.1}$ which has a work function of about 5.0 eV for PMOS gate use and then implanting more Y to form $Pd_{0.6}Y_{0.4}$ which has a work function of about 4.0 eV for NMOS with the implant energy set to ensure that in a neighborhood of the gate dielectric $Pd_{0.6}Y_{0.4}$ forms.

Another metal combination is niobium (Nb) and iridium (Ir). Initially deposit 30 nm of niobium (Nb) which has a work function about 4.0 eV and will yield the NMOS gates. Then implant iridium (Ir) which has a work function about 5.3 to form intermetallic $Ir_3Nb$ with a work function of about 5.0 eV; this will yield the PMOS gates. Use a thin initial Nb layer to minimize the straggle of the heavy Ir implant. Then deposit a cladding layer for low resistivity.

An analogous further metal combination is molybdenum (Mo) and iridium (Ir). Initially deposit 30 nm of molybdenum (Mo) which has a work function about 4.2 eV and will yield the NMOS gates. Then implant iridium (Ir) which has a work function about 5.3 to form intermetallic $Ir_3Mo$ with a work function of about 5.0 eV; this will yield the PMOS gates. Use a thin initial Mo layer to minimize the straggle of the heavy Ir implant. Then deposit a cladding layer for low resistivity.

Diffusion barrier preferred embodiments generally use two metals, M1 and M2, and selectively limit with a barrier the formation of alloys/intermetallics to obtain two work functions. In particular, deposit M1 and a masking material (e.g., $SiO_2$) that does not react with M1 or M2. Pattern the masking material so that areas that need M1/M2 alloy work function are exposed. Etch the masking material and remove the resist. Blanket deposit M2 and anneal to form alloy in areas no longer covered by masking material. Etch residual M2 from areas where alloy did not form (blanket etch, needs to be selective to M1 and the alloy). Remove the remaining masking material. If needed, blanket deposit low resistivity cladding layer. The relative thicknesses of M1 and M2 determine the resultant alloy/intermetallic. Thus for the case of palladium as M1 and yttrium as M2, an M1 thickness of 100 nm would require 74 nm thickness of M2 to yield a 75% M1 and 25% M2 alloy because the density of Pd is 12.0 and the density of Y is 4.46.

Selective diffusion preferred embodiments generally use two metals, M1 and M2, and selectively provide M2 to form alloys/intermetallics to obtain two work functions. In particular, deposit metal M1 and metal M2 (solid solution or intermetallic forming). Adjust thicknesses so that M1/M2 alloy sets one work function and M1 sets second work function. Perform non-critical pattern and remove M2 in areas where M1 work function is desired (need selective etch). Anneal to form M1/M2 alloy. If needed, deposit cladding layer to lower sheet resistance.

What is claimed is:

1. A method of fabrication of CMOS devices, comprising:
   (a) forming a first layer on a gate dielectric on a surface of a substrate, said first layer of a first metallic material with a work function for PMOS gates;
   (b) implanting a second metallic material into an implant region of said first layer, said implanting peaking about 10 nm from said gate dielectric; and
   (c) forming gates from said first layer, with NMOS gates at said implant region and PMOS gates away from said implant region.

2. The method of claim 1, further comprising:
   (a) after step (b) of claim 1 annealing said first layer.

3. The method of claim 1, wherein:
   (a) said first metallic material includes palladium.

4. The method of claim 1, wherein:
   (a) said second metallic material includes yttrium.

5. The method of claim 1, wherein:
   (a) said substrate adjacent said surface includes silicon regions and dielectric isolation regions.

6. The method of claim 1, wherein:
   (a) said first layer has a thickness of about 100 nm or less.

7. The method of claim 1, further comprising:
   (a) after step (b) of claim 1 depositing a cladding layer on said first layer.

8. A method of fabrication of CMOS devices, comprising:
   (a) forming a first layer on a gate dielectric on a surface of a substrate, said first layer of a first metallic material with a work function for NMOS gates;
   (b) implanting a second metallic material into an implant region of said first layer, said implanting peaking about 10 nm from said gate dielectric; and
   (c) forming gates from said first layer, with PMOS gates at said implant region and NMOS gates away from said implant region.

9. The method of claim 8, further comprising:
   (a) after step (b) of claim 1 annealing said first layer.

10. The method of claim 8, wherein:
    (a) said first metallic material includes a metal selected from the group consisting of niobium and molybdenum and mixtures thereof.

11. The method of claim 8, wherein:
    (a) said second metallic material includes iridium.

12. The method of claim 8, wherein:
    (a) said substrate adjacent said surface includes silicon regions and dielectric isolation regions.

13. The method of claim 8, wherein:
    (a) said first layer has a thickness of about 100 nm or less.

14. The method of claim 8, further comprising:
    (a) after step (b) of claim 1 depositing a cladding layer on said first layer.

* * * * *